(12) United States Patent
Lee et al.

(10) Patent No.: US 12,094,949 B2
(45) Date of Patent: Sep. 17, 2024

(54) FIN-TYPE FIELD EFFECT TRANSISTOR HAVING A WRAP-AROUND GATE WITH BOTTOM ISOLATION AND INNER SPACERS TO REDUCE PARASITIC CAPACITANCE

(71) Applicant: International Business Machines Corporation, Armonk, NY (US)

(72) Inventors: Choonghyun Lee, Chigasaki (JP); Chanro Park, Clifton Park, NY (US); Ruilong Xie, Niskayuna, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 293 days.

(21) Appl. No.: 17/484,019

(22) Filed: Sep. 24, 2021

(65) Prior Publication Data

US 2023/0096125 A1    Mar. 30, 2023

(51) Int. Cl.
*H01L 29/423* (2006.01)
*H01L 21/02* (2006.01)
*H01L 21/28* (2006.01)
*H01L 29/06* (2006.01)
(Continued)

(52) U.S. Cl.
CPC .... *H01L 29/42392* (2013.01); *H01L 21/0259* (2013.01); *H01L 21/28229* (2013.01); *H01L 29/0665* (2013.01); *H01L 29/66553* (2013.01); *H01L 29/66742* (2013.01);
(Continued)

(58) Field of Classification Search
CPC ......... H01L 29/42392; H01L 29/66553; H01L 29/66742; H01L 2029/42388
See application file for complete search history.

(56) References Cited

U.S. PATENT DOCUMENTS

| | | |
|---|---|---|
| 9,202,917 B2 | 12/2015 | Ching et al. |
| 9,716,174 B2 | 7/2017 | Akarvardar et al. |
| 10,332,999 B1 | 6/2019 | Cheng et al. |

(Continued)

OTHER PUBLICATIONS

Cheng et al., "Bottom oxidation through STI (BOTS)—a Novel Approach to Fabricate Dielectric Isolated FinFET on Bulk Substrates," 2014 Symposium on VLSI Technology (VLSI-Technology): Digest of Technical Papers, IEEE, 2014, 2 pages.

*Primary Examiner* — Eric K Ashbahian
*Assistant Examiner* — Halee Cramer
(74) *Attorney, Agent, or Firm* — CANTOR COLBURN LLP; Samuel Waldbaum

(57) ABSTRACT

Embodiments of the invention include a semiconductor device having a fin-shaped channel with a bottom surface, sidewalls and a top surface. A first source or drain (S/D) region is communicatively coupled to the fin-shaped channel, and a sub-channel region is between the bottom surface of the fin-shaped channel and a substrate. A U-shaped dielectric region within a first portion of the sub-channel region, wherein the U-shaped dielectric region includes a bottom isolation layer and a first inner spacer region. A wrap-around gate structure extends around the bottom surface, the sidewalls and the top surface of the fin-shaped channel, wherein a bottom region of the wrap-around gate structure is within a second portion of the sub-channel region.

15 Claims, 14 Drawing Sheets

(51) Int. Cl.
 *H01L 29/66* (2006.01)
 *H01L 29/786* (2006.01)
(52) U.S. Cl.
 CPC .. *H01L 29/78618* (2013.01); *H01L 29/78696* (2013.01); *H01L 2029/42388* (2013.01)

(56) References Cited

U.S. PATENT DOCUMENTS

| | | |
|---|---|---|
| 10,680,083 B2 | 6/2020 | Bao et al. |
| 10,930,793 B2 | 2/2021 | Chao et al. |
| 2017/0005190 A1 | 1/2017 | Chang et al. |
| 2019/0157386 A1* | 5/2019 | Ando ................ H01L 21/02543 |
| 2020/0118886 A1* | 4/2020 | Miao ............... H01L 21/823821 |
| 2021/0296500 A1* | 9/2021 | Chan ................... H01L 29/775 |
| 2021/0320210 A1* | 10/2021 | Lin ................... H01L 29/78696 |

* cited by examiner

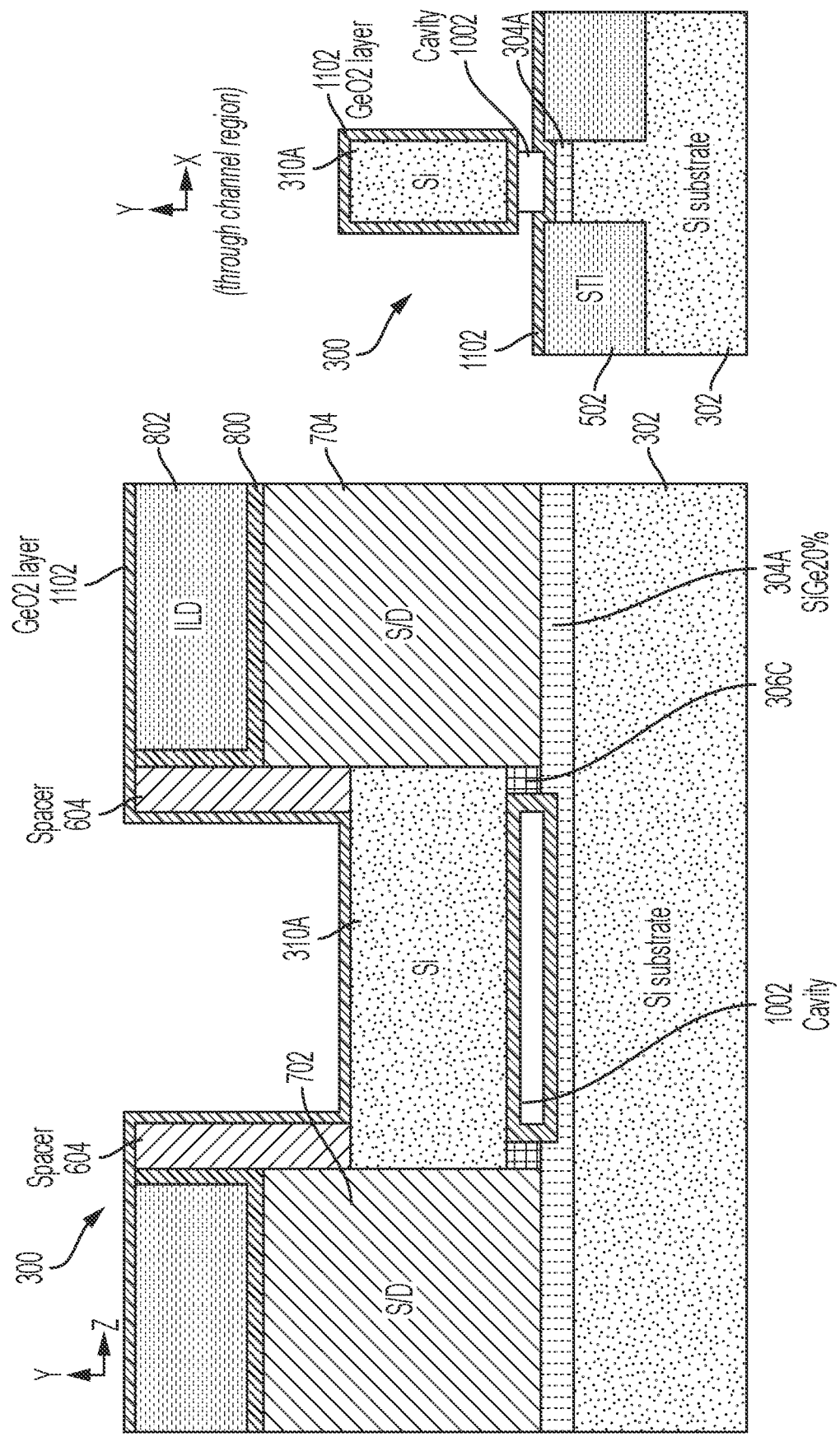

FIN-TYPE FIELD EFFECT TRANSISTOR HAVING A WRAP-AROUND GATE WITH BOTTOM ISOLATION AND INNER SPACERS TO REDUCE PARASITIC CAPACITANCE

BACKGROUND

The present invention relates in general to fabrication methods and resulting structures for semiconductor devices. More specifically, the present invention relates to fabrication methods and resulting structures for fin-type field effect transistors (FinFETs) having a wrap-around gate with bottom isolation and inner spacers to reduce parasitic capacitance.

In an integrated circuit (IC) having a plurality of planar metal oxide semiconductor field effect transistors (MOSFETs), each MOSFET has a source and a drain that are formed in an active region of a semiconductor layer by introducing n-type or p-type impurities in a layer of semiconductor material. A channel is between the source and the drain, and a gate is above the channel. The gate and channel are spaced apart by a gate dielectric. When a sufficient voltage is applied to the gate, the channel becomes conductive and allows current to flow from the source through the channel to the drain.

Transistors are formed in a variety of configurations. For example, FinFETs are non-planar transistor architectures that employ semiconductor fins and a gate structure wrapped over the sidewalls and top of a central portion of the fin. The central portion of the fin functions as the channel, and the portions of the fin that are not under the gate function as the source and the drain.

SUMMARY

Embodiments of the invention include a semiconductor device having a fin-shaped channel with a bottom surface, sidewalls and a top surface. A first source or drain (S/D) region is communicatively coupled to the fin-shaped channel, and a sub-channel region is defined between the bottom surface of the fin-shaped channel and a substrate. A U-shaped dielectric region is within a first portion of the sub-channel region, wherein the U-shaped dielectric region includes a bottom isolation layer and a first inner spacer region. A wrap-around gate structure extends around the bottom surface, the sidewalls and the top surface of the fin-shaped channel, wherein a bottom region of the wrap-around gate structure is within a second portion of the sub-channel region. The bottom isolation layer provides electrical isolation between the fin-shaped channel from the substrate, and the first inner spacer reduces parasitic capacitance between the bottom region of the wrap-around gate structure and the first S/D region.

Embodiments of the invention include a method of forming a semiconductor device having a fin-shaped channel with a bottom surface, sidewalls and a top surface. A S/D region formed and communicatively coupled to the fin-shaped channel. A sub-channel region is defined between the bottom surface of the fin-shaped channel and a substrate. A U-shaped dielectric region is formed within a first portion of the sub-channel region, wherein the U-shaped dielectric region includes a bottom isolation layer and a first inner spacer region. A wrap-around gate structure is formed such that it extends around the bottom surface, the sidewalls and the top surface of the fin-shaped channel, wherein a bottom region of the wrap-around gate structure is within a second portion of the sub-channel region. The bottom isolation layer provides electrical isolation between the fin-shaped channel from the substrate, and the first inner spacer reduces parasitic capacitance between the bottom region of the wrap-around gate structure and the first S/D region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 3-13B depict cross-sectional views of a section of a substrate/wafer after various fabrication operations to form the transistor shown in FIGS. 2A and 2B according to embodiments of the invention, in which:

FIG. 3 depicts a cross-sectional view of the substrate/wafer after fabrication operations for forming the transistor shown in FIGS. 2A and 2B in accordance with embodiments of the invention;

FIG. 4 depicts a cross-sectional view of the substrate/wafer after fabrication operations for forming the transistor shown in FIGS. 2A and 2B in accordance with embodiments of the invention;

FIG. 5 depicts a cross-sectional view of the substrate/wafer after fabrication operations for forming the transistor shown in FIGS. 2A and 2B in accordance with embodiments of the invention;

FIG. 11A depicts a cross-sectional view of the substrate/wafer after fabrication operations for forming the transistor shown in FIGS. 2A and 2B in accordance with embodiments of the invention;

FIG. 11B depicts a cross-sectional view of the substrate/wafer shown in FIG. 11A;

FIG. 13A depicts a cross-sectional view of the substrate/wafer after fabrication operations for forming the transistor shown in FIGS. 2A and 2B in accordance with embodiments of the invention;

FIG. 13B depicts a cross-sectional view of the substrate/wafer shown in FIG. 13A.

Figure 1:
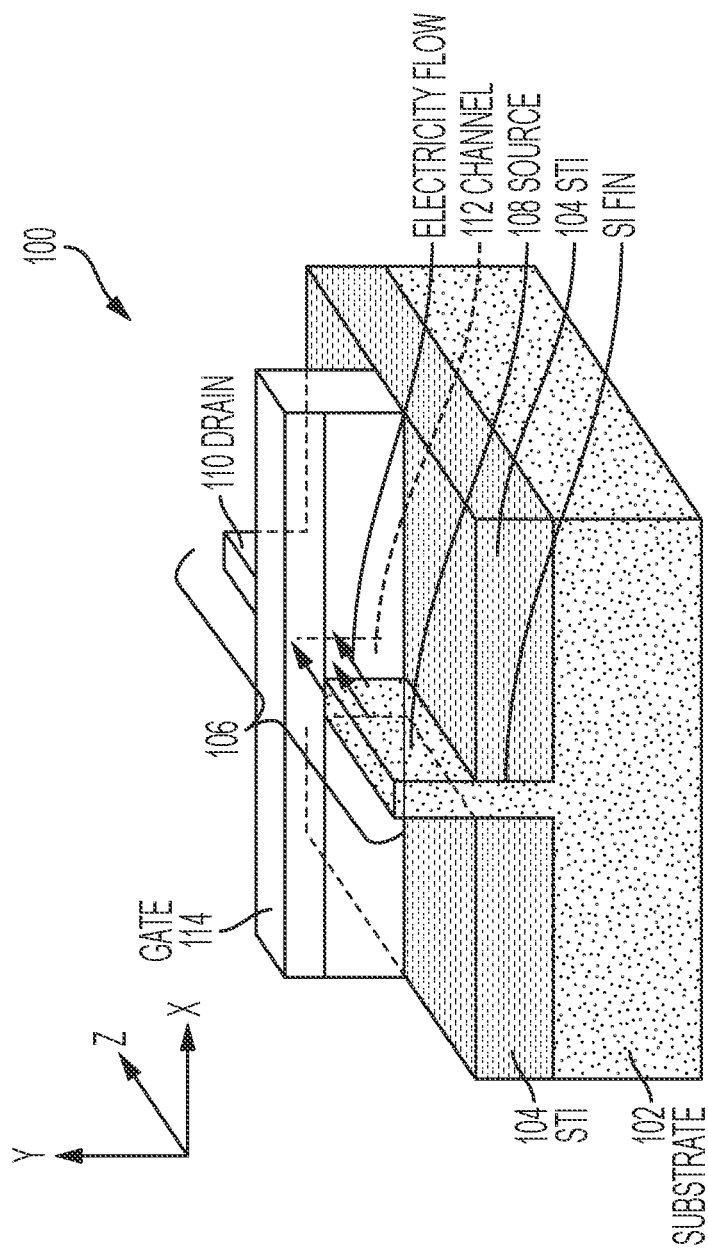
FIG. 1 depicts a three-dimensional view of a FinFET device architecture capable of implementing aspects of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two-digit or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, semiconductor devices are typically formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

FinFETs are non-planar MOSFETs that employ semiconductor fins and a gate structure wrapped over the sidewalls and top of a central portion of the fin. The central portion of the fin functions as the channel, and the portions of the fin that are not under the gate function as the source and the drain. Raised source/drain (S/D) regions can be epitaxially grown over the S/D portions of the fin to increase the S/D volume and provide a larger surface for interfacing with S/D conductive contacts. N-type FETs require different S/D doping than p-type FETS. For example, an n-type S/D can be formed from silicon (Si) doped with phosphorous, and a p-type S/D can be formed from silicon germanium (SiGe) doped with boron (B).

Current bulk FinFET fabrication processes require a punch through stopper (PTS) layer below the active fin to suppress the off-state current (e.g., through a sub-fin leakage path), which results in undesired channel doping during the downstream thermal processes. This leads to device performance degradation such as Vt (threshold voltage) variation and carrier mobility degradation. With aggressive device scaling, particularly in short channel devices, it becomes more difficult to control the short-channel-effects due to the sub-fin leakage current path.

Embodiments of the invention address the above-described shortcomings in known FinFET architectures by providing a method and structure for fabricating a gate-all-around (GAA) FinFET configured and arranged to not provide a sub-fin leakage path. In some embodiments of the invention, an opening is formed through the channel portion of the fin, thereby defining a cavity or sub-channel region between the channel portion of the fin and the substrate. A bottom surface and sidewalls of the sub-channel region are lined with an insulating dielectric to form a bottom isolation region on the bottom surface of the sub-channel region, and to further form inner spacers on the sidewalls of the sub-channel region. The final gate structure is formed on sidewalls and a top surface of the channel portion of the fin, as well as within the sub-channel region extending through the channel portion of the fin, thereby forming a wrap-around gate that extends completely around a circumference of the channel portion of the fin. The portion of the insulating dielectric that forms the bottom isolation region provides bottom isolation for the wrap-around gate structure to block a path for sub-fin leakage current flowing from the channel portion of the fin into the substrate. The portion of the insulating dielectric that forms the inner spacers are between the sub-channel region and the S/D regions, thereby reducing the parasitic capacitance between the S/D regions and the portion of the wrap-around gate that is below the channel portion of the fin and within the sub-channel region. Thus, embodiments of the invention can resolve intrinsic challenges of bulk FinFETs, including defining accurate fin height and effective fin width; eliminating dopant diffusion into the active fin that occurs when a punch-through stopper (PTS) layer is required; and reducing parasitic channel formation in the fin bottom due to the out-diffusion of dopants from the S/D regions.

In embodiments of the invention, the above-described cavity or sub-channel region and the insulating dielectric liner can be formed by forming first and second SiGe sacrificial layers below the channel portion of the fin; selectively removing the first SiGe sacrificial layer to form the sub-channel region; depositing a uniform layer of $GeO_2$ on the bottom surface and sidewalls of the sub-channel region which is formed from the second SiGe sacrificial layer; and reacting $GeO_2$ with second SiGe sacrificial layer to selectively form $SiO_2$ (the insulating dielectric liner) on the bottom surface and sidewalls of the sub-channel region, thereby forming the bottom isolation region and the inner spacers.

Embodiments of the invention are not limited to a particular FET architecture and can be applied to any FET having a S/D. Accordingly, embodiments of the invention can be applied to a FinFET, a planar FET, a nanowire FET, a nanosheet FET, a vertical FET (VFET), and the like.

Turning now to a more detailed description of embodiments of the invention, FIG. 1 depicts a three-dimensional view of a FinFET 100 capable of implementing the wrap-around gate, bottom isolation, and inner spacer aspects of the invention. is shown in FIG. 1. The basic electrical layout and mode of operation of FinFET 100 do not differ significantly from a traditional FET. FinFET 100 includes a semiconductor substrate 102, shallow trench isolation (STI) layers 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin 106 is shown in FIG. 1. In practice, FinFET devices can be fabricated having multiple fins formed on STI 104 and substrate 102. Substrate 102 can be silicon, STI 104 can be an oxide (e.g., silicon oxide), and the fin 106 can be silicon that has been enriched to a desired concentration level of germanium. The gate 114 controls the source to drain current flow (labeled ELECTRICITY FLOW in FIG. 1).

In contrast to planar MOSFETs, source 108, drain 110 and channel 112 of the FinFET 100 are formed from the fin 106, which is built as a three-dimensional bar on top of the semiconductor substrate 102. The fin 106 extends through the STI layer 104 and serves as the body of the device. The gate electrode 114 is then wrapped over the top and sides of a central portion of the fin 106. The central portion of the fin functions as the channel 112. The source and drain regions 108, 110 are the portions of the fin 106 on either side of the channel 112 that are not under the gate electrode 114.

In some FinFET architectures, raised source/drain (S/D) regions (not shown in FIG. 1) can be epitaxially grown over the S/D portions 108, 110 of the fin 106 to increase the S/D volume and provide a larger surface for interfacing S/D conductive contacts (not shown in FIG. 1) with the raised S/D region. The S/D contacts are formed on either side of the gate structure 114, which includes a conductive material (e.g., tungsten (W), aluminum (Al), and the like), which is bound at its lower portion by a dielectric liner (not shown).

Figures 2A, 2B:
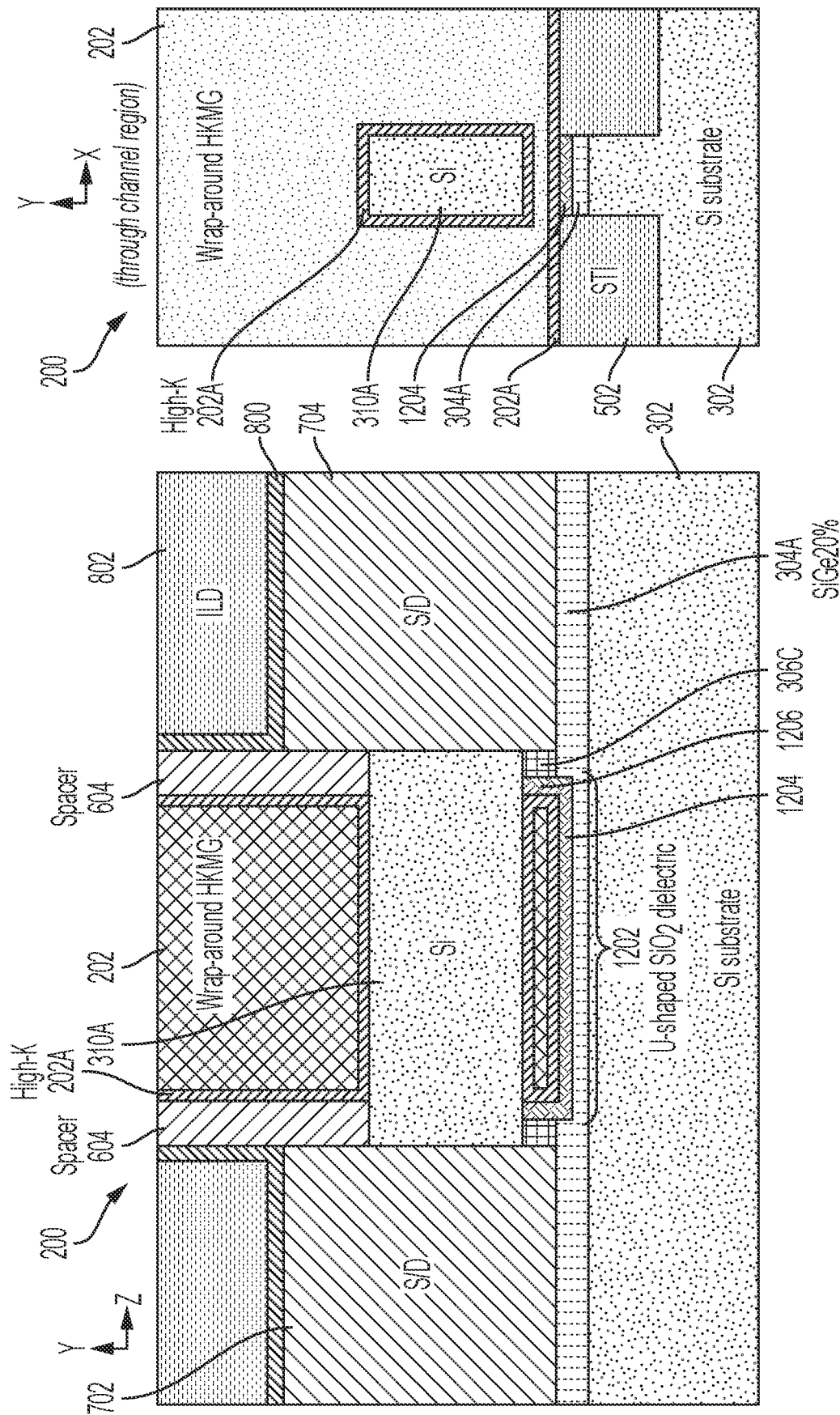
FIG. 2A depicts a cross-sectional view of a transistor fabricated in accordance with embodiments of the invention.
FIG. 2B depicts another cross sectional view of the transistor shown in FIG. 2A.

FIG. 2A depicts a cross-sectional view (along the Y/Z axis shown in FIG. 1) of a transistor 200 fabricated in accordance with embodiments of the invention, and FIG. 2B depicts another cross-sectional view (along the X/Y axis shown in FIG. 1) of the transistor 200 shown in FIG. 2A. As best shown in FIG. 2A, the transistor 200 is an FinFET architecture formed on a substrate 302. The FinFET 200 includes doped Si raised S/D regions 702, 704; a Si channel region 310A (which can be lightly doped or undoped); a wrap-around high-k metal gate (HKMG) 202, and gate spacers 604, configured and arranged as shown. The FinFET 200 further includes a U-shaped dielectric 1202 having a bottom isolation region 1204 and integral inner spacers 1206; a first sacrificial layer 304A; and a second sacrificial layer 306C. A dielectric liner 800 and an interlayer dielectric (ILD) 802 are formed over the FinFET 200.

In accordance with aspects of the invention, the wrap-around HKMG 202 increases transistor performance by increasing the surface area of contact between the wrap-around HKMG 202 and the channel region 310A without creating unwanted sub-fin leakage paths. In accordance with aspects of the invention, the bottom isolation region 1204 prevents unwanted sub-fin leakage paths by blocking unwanted current flow from the channel region 310A into the substrate 302. The inner spacers 1206 are between a bottom portion of the wrap-around HKMG 202 and the S/D regions 702, 704, thereby reducing the parasitic capacitance between the S/D regions 702, 704 and the portion of the wrap-around HKMG 202 that is below the channel region 310A. Thus, the FinFET 200 can resolve intrinsic challenges of bulk FinFETs, including defining accurate fin height and effective fin width; eliminating dopant diffusion into the active fin that occurs when a punch-through stopper (PTS) layer is required; and reducing parasitic channel formation in the fin bottom due to the out-diffusion of dopants from the S/D regions.

Figure 3:
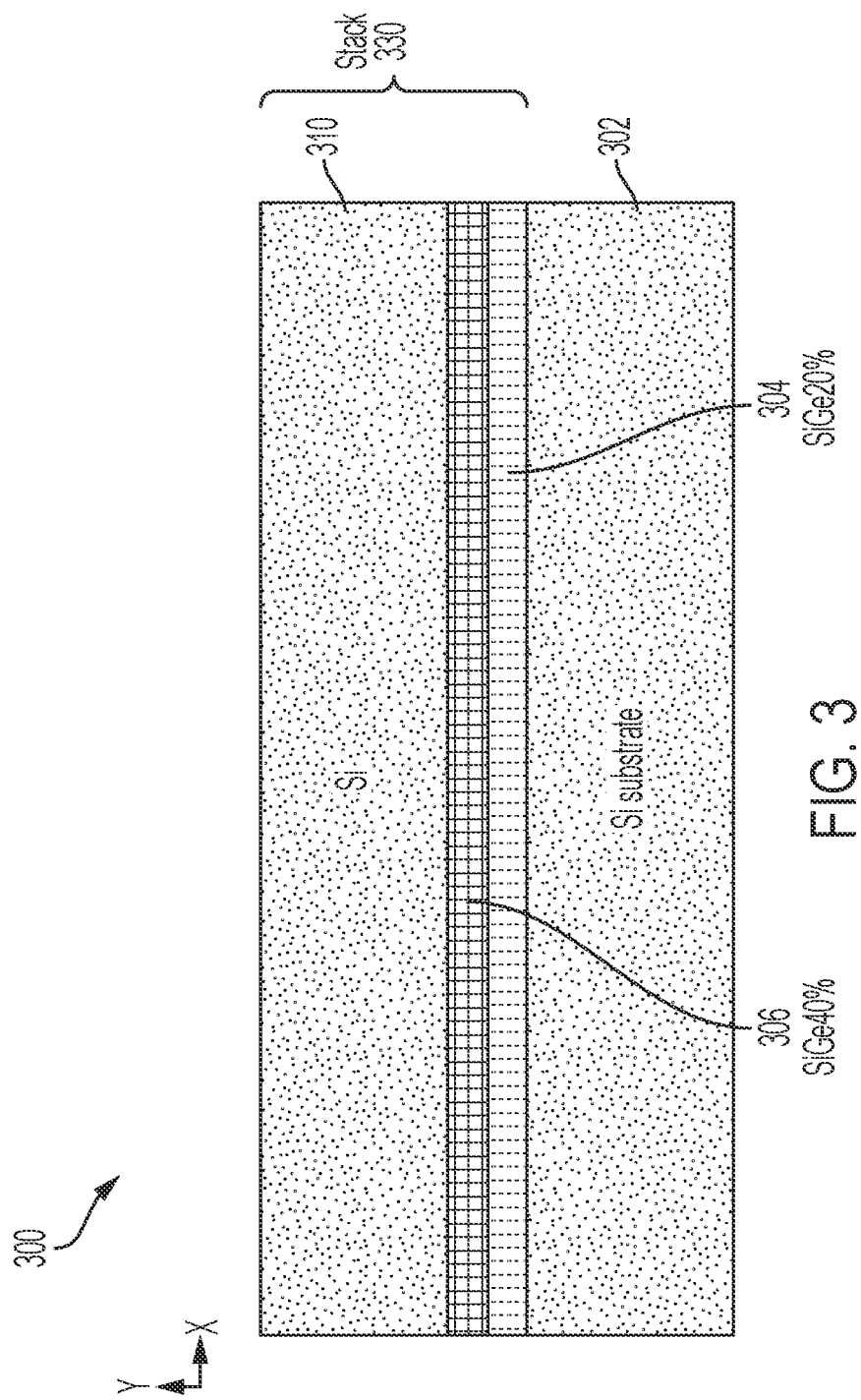

FIGS. 3-13B depict cross-sectional views of a section of a substrate/wafer 300 after various fabrication operations to form the FinFET 200 shown in FIGS. 2A and 2B according to embodiments of the invention. Turning first to FIG. 3, a cross-sectional view (along the Y/X axis shown in FIG. 1) of the wafer 300 is depicted after initial fabrication operations in accordance with aspects of the invention. As shown, a stack 330 is formed over the substrate 302. The stack 330 includes a first SiGe sacrificial layer 304, a second SiGe sacrificial layer 306, and a top Si 310. In accordance with aspects of the invention, the stack 330 is formed by epitaxially growing one layer then the next until the layers and layer thicknesses are achieved.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, the first SiGe sacrificial layer 304 can be about SiGe 20%. The notation "SiGe 20%" is used to indicate that 20% of the SiGe material is Ge and 80% of the SiGe material is Si. In some embodiments of the invention, the Ge percentage in the SiGe sacrificial layers 304 can be any value, including, for example a value within the range from about 20% to about 35%.

In embodiments of the invention, the second SiGe sacrificial layer 306 has a Ge percentage that is sufficiently greater than the Ge percentage in the first SiGe sacrificial layer 304 to provide etch selectivity between the first sacrificial layer 304 and the second sacrificial layer 306. In some aspects of the invention, the Ge percentage in the second SiGe sacrificial layer 306 is above about 40% and within a range from about 40% to about 55%. In some aspects of the invention, the first sacrificial layer 304 can be SiGe 20%, and the second sacrificial nanosheet layer 306 can be at or above about SiGe 40%.

Figure 4:
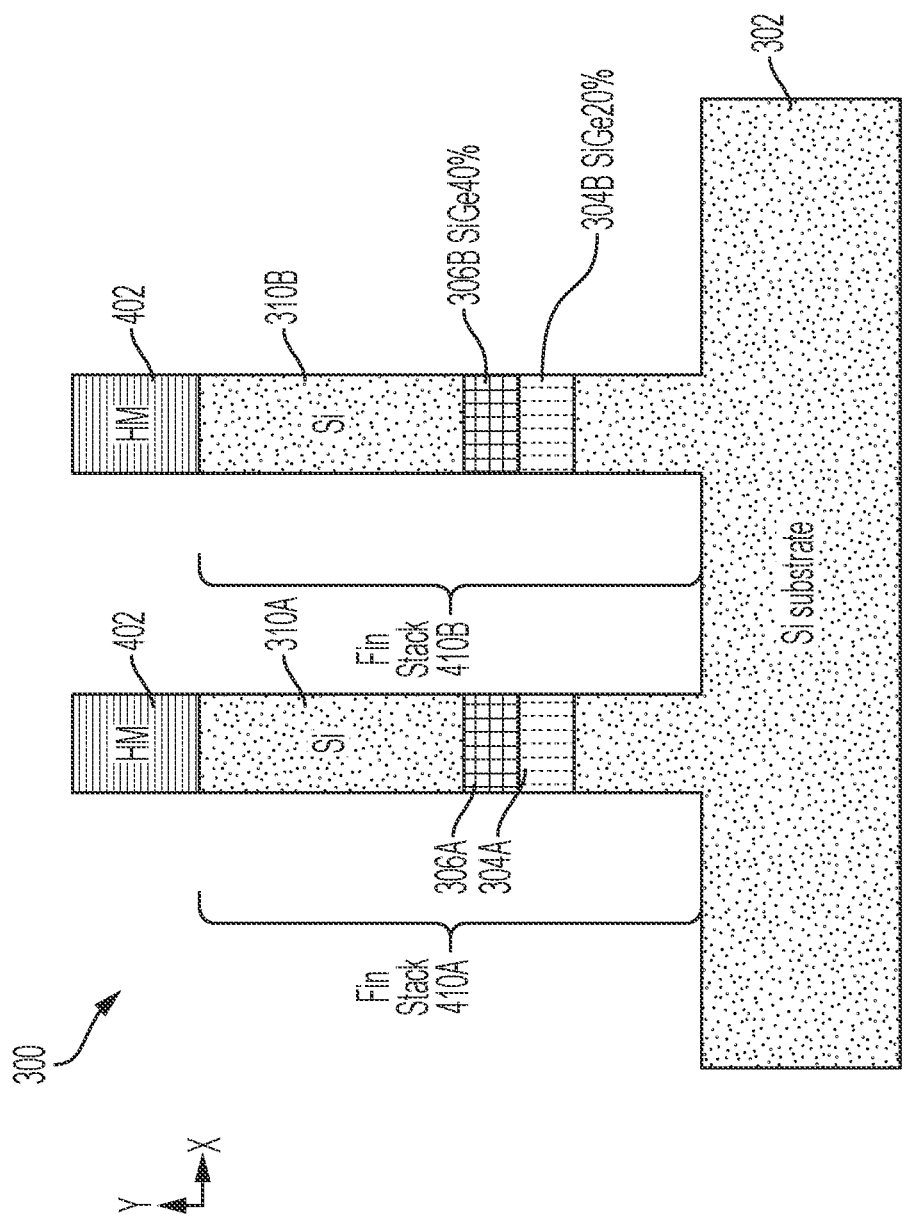

FIG. 4 depicts a cross-sectional view (along the Y/X axis shown in FIG. 1) of the wafer 300 after additional fabrication operations in accordance with aspects of the invention. As shown, a hard mask layer (not shown) is deposited over the stack 330 (shown in FIG. 3), and the hard mask layer and the stack 330 are etched to define the hard masks (HM) 402 and the fin stacks 410A, 410B. The hard mask layer and the resulting HM 402 can be any suitable dielectric, including but not limited to SiN. The fin stack 410A is formed from an active fin 310A, a portion of the second sacrificial layer 306A, a portion of the first sacrificial layer 304A, and a non-active region of the fin 310A. The fin stack 410B is formed from an active fin 310B, a portion of the second sacrificial layer 306B, a portion of the first sacrificial layer 304B, and a non-active region of the fin 310B.

Figure 5:
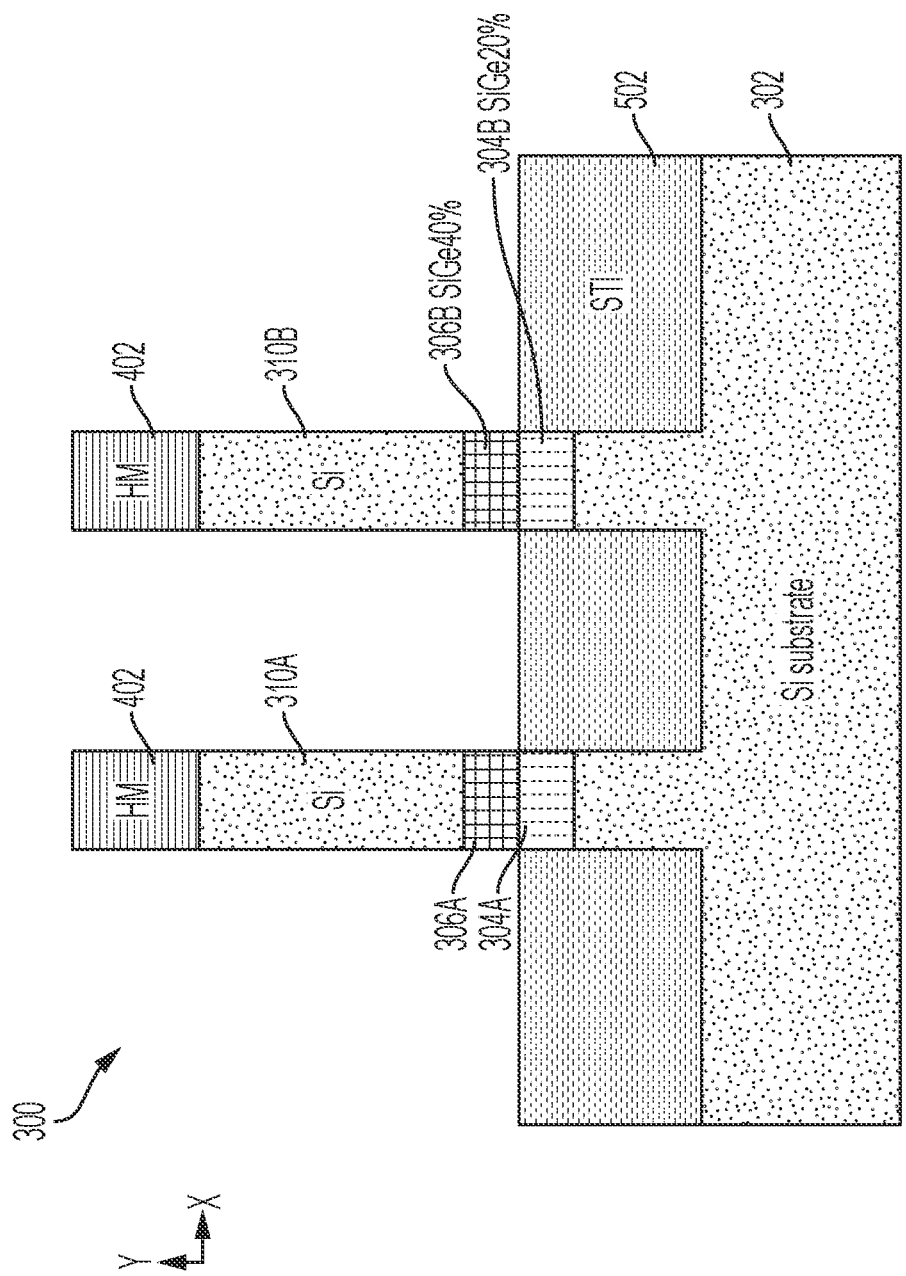

FIG. 5 depicts a cross-sectional view (along the Y/X axis shown in FIG. 1) of the wafer 300 after additional fabrication operations in accordance with aspects of the invention. As shown, a local oxide (e.g., silicon oxide) is deposited between fin stacks 410A, 410B (including the non-active portion of the fins 310A, 310B formed from the silicon substrate 302) and over substrate 302. The local oxide is polished and recessed back to form STI regions 502, and to expose the active fins 310A, 310B.

Figures 6A, 6B:
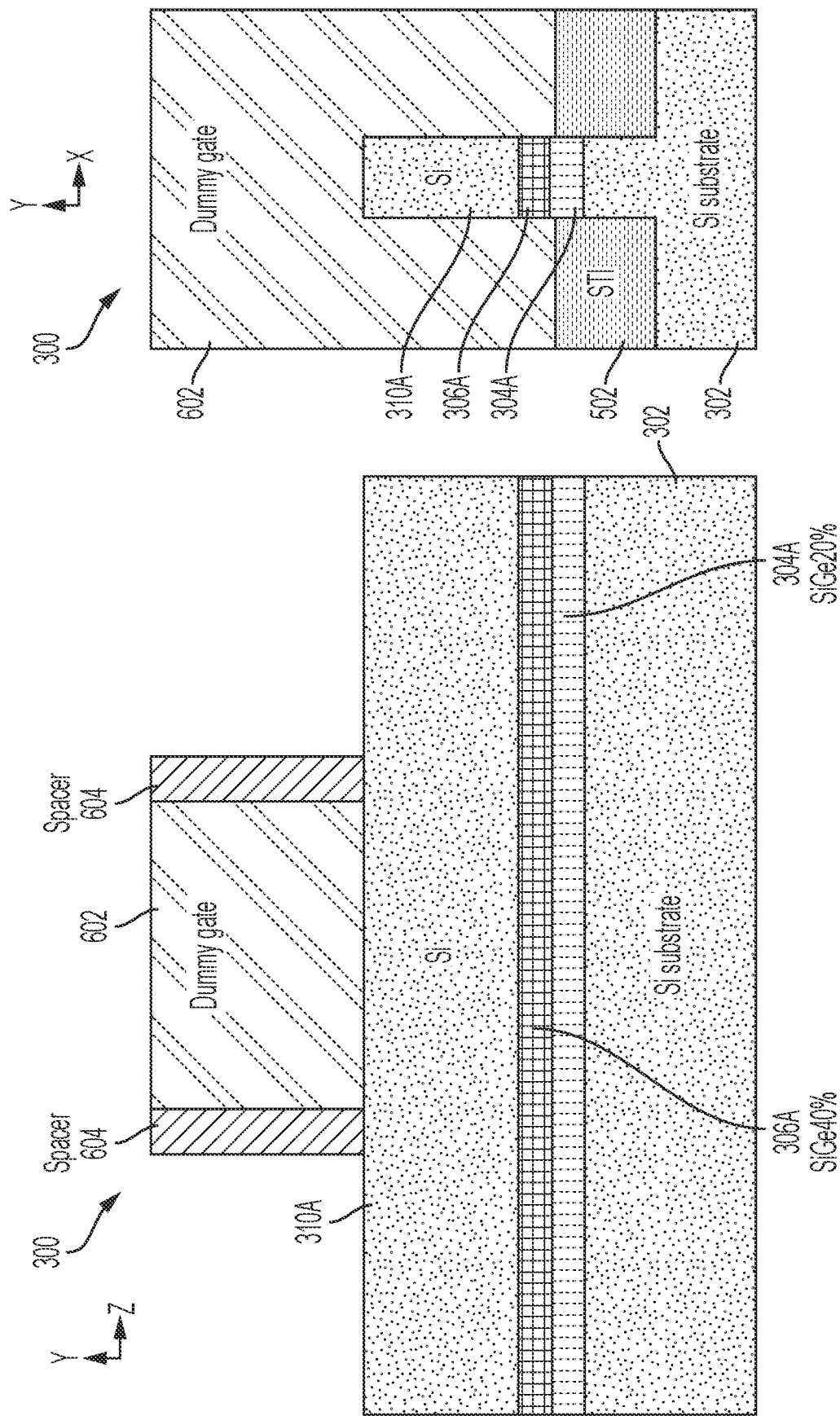
FIG. 6A depicts a cross-sectional view of the substrate/wafer after fabrication operations for forming the transistor shown in FIGS. 2A and 2B in accordance with embodiments of the invention.
FIG. 6B depicts a cross-sectional view of the substrate/wafer shown in FIG. 6A.

FIG. 6A depicts a cross-sectional view (along the Y/Z axis shown in FIG. 1) of the wafer 300 after additional fabrication operations in accordance with embodiments of the invention, and FIG. 6B depicts another cross-sectional view (along the X/Y axis shown in FIG. 1) of the wafer 300 shown in FIG. 6A. As best shown in FIG. 6A, the hard masks 402 have been removed using any suitable technique, such as an RIE process. A dummy gate 602 is deposited perpendicular to the lengths of the active fins 310A, 310B. The dummy gate 602 can be formed by deposition of a polysilicon material, planarization using a suitable process such as, for example, chemical mechanical polishing (CMP), gate lithography, and reactive ion etching (RIE) that defines the dummy gate stack 602. Gate spacers 604 have been formed along the outer sidewalls of the dummy gate 602. The material of the gate spacers 602 can include, for example, dielectric oxides (e.g., silicon oxide), dielectric nitrides (e.g., silicon nitride), dielectric oxynitrides, silicon carbon-oxide, silicon boron-carbon-nitride or any combination thereof. The spacer material is deposited by a deposition process, for example, chemical vapor deposition (CVD), atomic layer deposition (ALD) or physical vapor deposition (PVD). The spacer material can be etched by a dry etch process, for example, a RIE process to form the gate spacers 604.

Figures 7A, 7B:
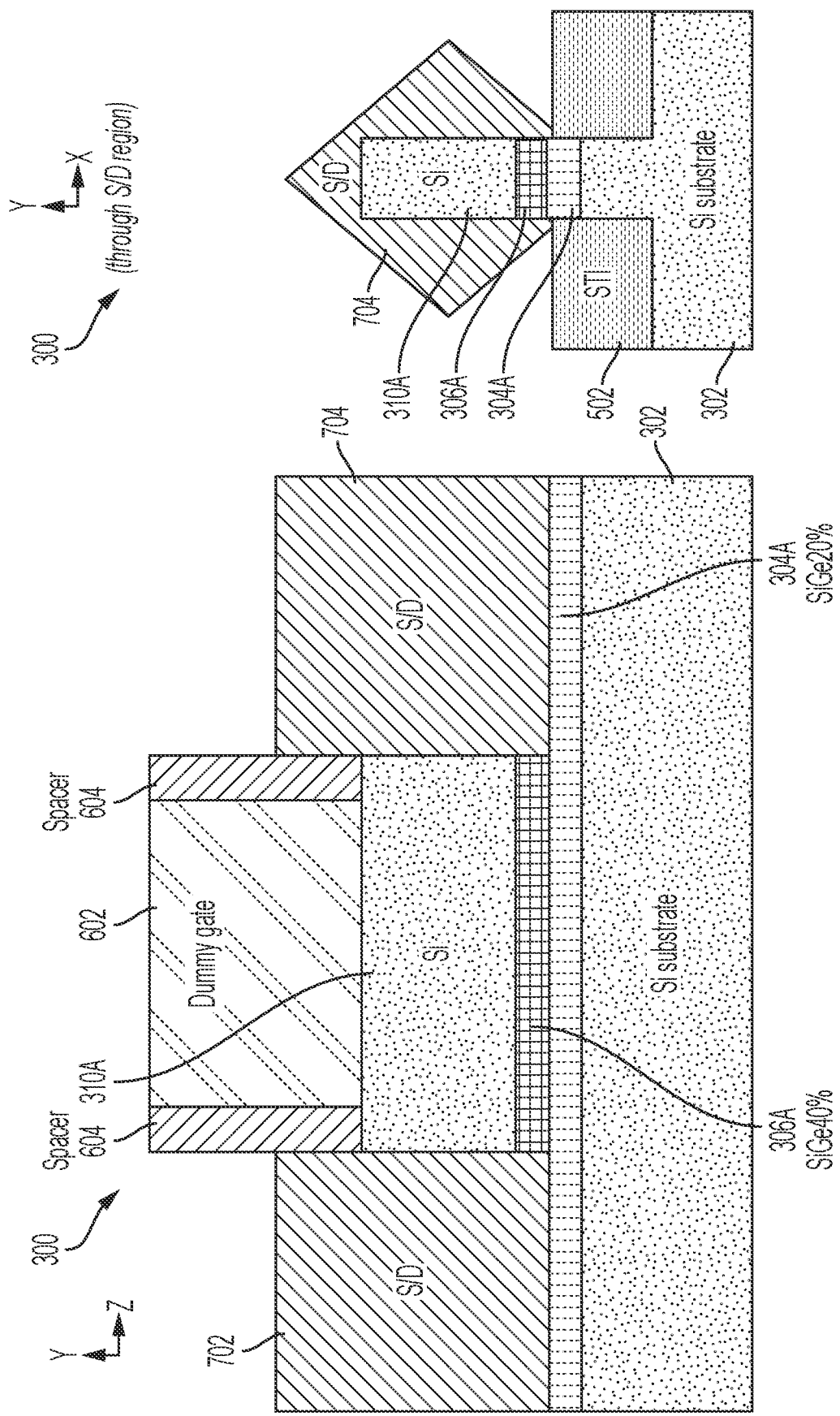
FIG. 7A depicts a cross-sectional view of the substrate/wafer after fabrication operations for forming the transistor shown in FIGS. 2A and 2B in accordance with embodiments of the invention.
FIG. 7B depicts a cross-sectional view of the substrate/wafer shown in FIG. 7A.

FIG. 7A depicts a cross-sectional view (along the Y/Z axis shown in FIG. 1) of the wafer 300 after additional fabrication operations in accordance with embodiments of the invention, and FIG. 7B depicts another cross-sectional view (along the X/Y axis shown in FIG. 1) of the wafer 300 shown in FIG. 7A. As best shown in FIG. 7A, known fabrication operations have been used to form a doped source or drain (S/D) region 702 and a doped S/D 704 on active fin 310A at opposite ends of the dummy gate 602. The doped S/D regions 702, 704 can be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RTCVD), metal organic chemical vapor deposition (MOCVD), low-pressure chemical vapor deposition (LPCVD), limited reaction processing CVD (LRPCVD), and MBE. In some embodiments of the invention, the doped S/D regions 702, 704 can be doped during deposition (in-situ doped) by adding dopants, n-type dopants (e.g., phosphorus or arsenic) or p-type dopants (e.g., Ga, B, $BF_2$, or Al). A dopant drive-in anneal (e.g., a rapid thermal anneal (RTA)) is performed to activate and drive in the implanted dopants.

Figures 8A, 8B:
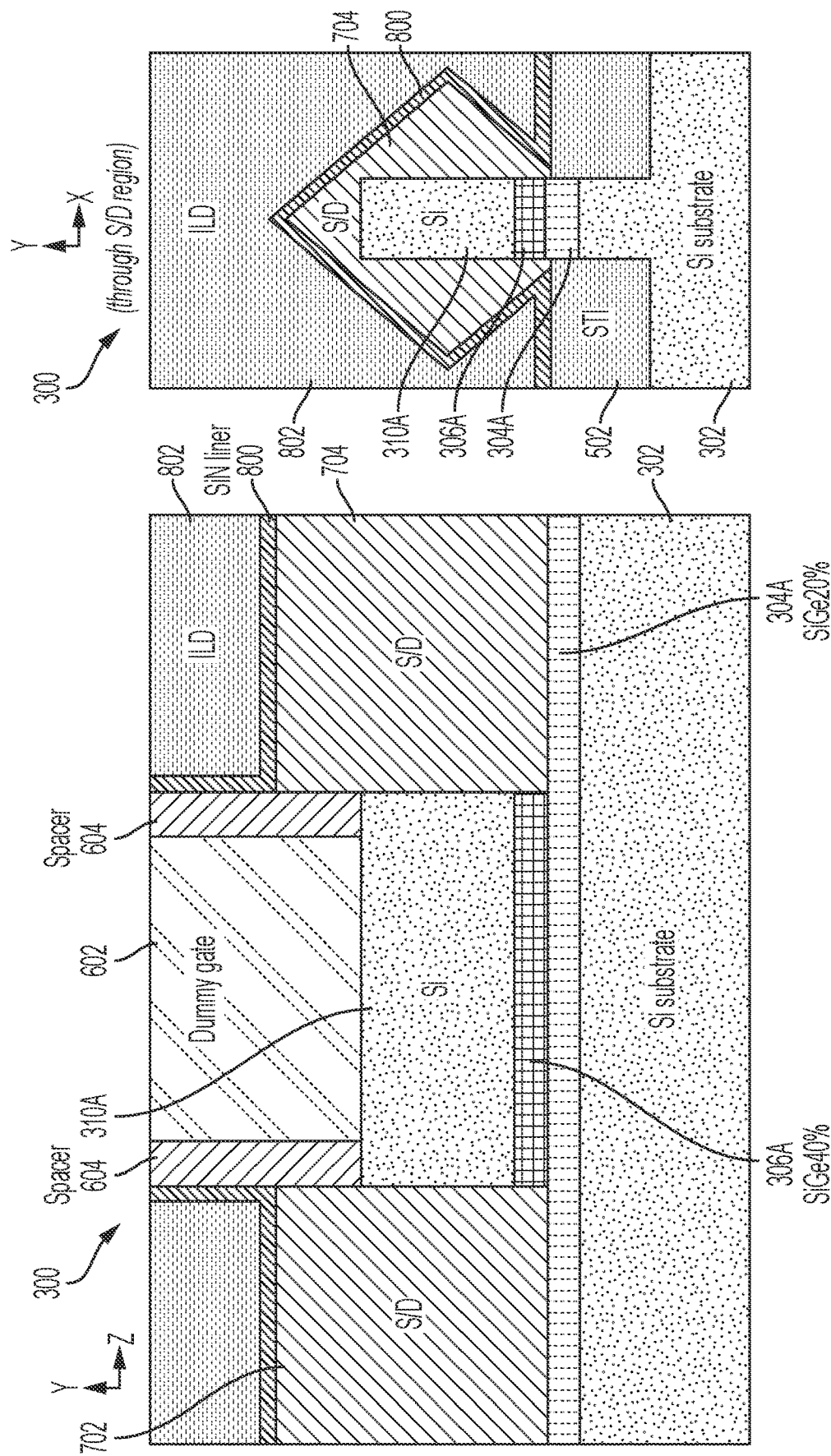
FIG. 8A depicts a cross-sectional view of the substrate/wafer after fabrication operations for forming the transistor shown in FIGS. 2A and 2B in accordance with embodiments of the invention.
FIG. 8B depicts a cross-sectional view of the substrate/wafer shown in FIG. 8A.

FIG. 8A depicts a cross-sectional view (along the Y/Z axis shown in FIG. 1) of the wafer 300 after additional fabrication operations in accordance with embodiments of the invention, and FIG. 8B depicts another cross-sectional view (along the X/Y axis shown in FIG. 1) of the wafer 300 shown in FIG. 8A. As best shown in FIG. 8A, known fabrication operations have been used to deposit a SiN liner 800 over the wafer 300. Known fabrication operations have been used to form an interlayer dielectric (ILD) layer 802, configured and arranged as shown. The ILD 802 can be made of any suitable dielectric material, such as, for example, porous silicates, carbon doped oxides, silicon dioxide, silicon nitrides, silicon oxynitrides, or other dielectric materials. Any known manner of forming the ILD 802 can be utilized. The ILD 802 can be formed using, for example, CVD, PECVD, ALD, flowable CVD (flowable oxide), spin-on dielectrics, or PVD. The ILD 802 is planarized to the level of the dummy gate 602 using any suitable techniques, such as, for example, a chemical-mechanical polishing (CMP).

Figures 9A, 9B:
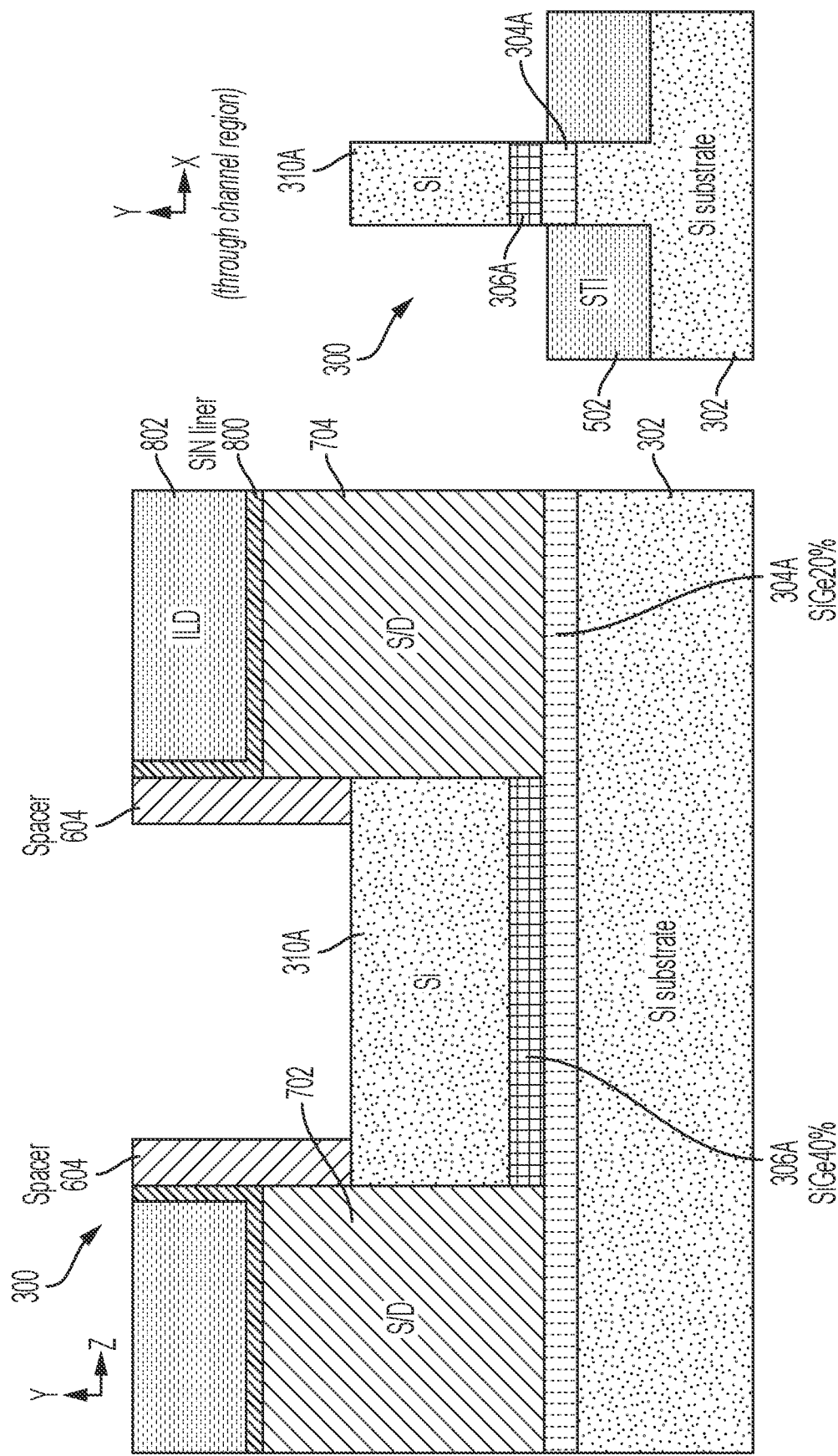
FIG. 9A depicts a cross-sectional view of the substrate/wafer after fabrication operations for forming the transistor shown in FIGS. 2A and 2B in accordance with embodiments of the invention.
FIG. 9B depicts a cross-sectional view of the substrate/wafer shown in FIG. 9A.

FIG. 9A depicts a cross-sectional view (along the Y/Z axis shown in FIG. 1) of the wafer 300 after additional fabrication operations in accordance with embodiments of the invention, and FIG. 9B depicts another cross-sectional view (along the X/Y axis shown in FIG. 1) of the wafer 300 shown in FIG. 9A. As best shown in FIG. 9A, known fabrication operations have been used to remove the dummy gate 602.

Figures 10A, 10B:
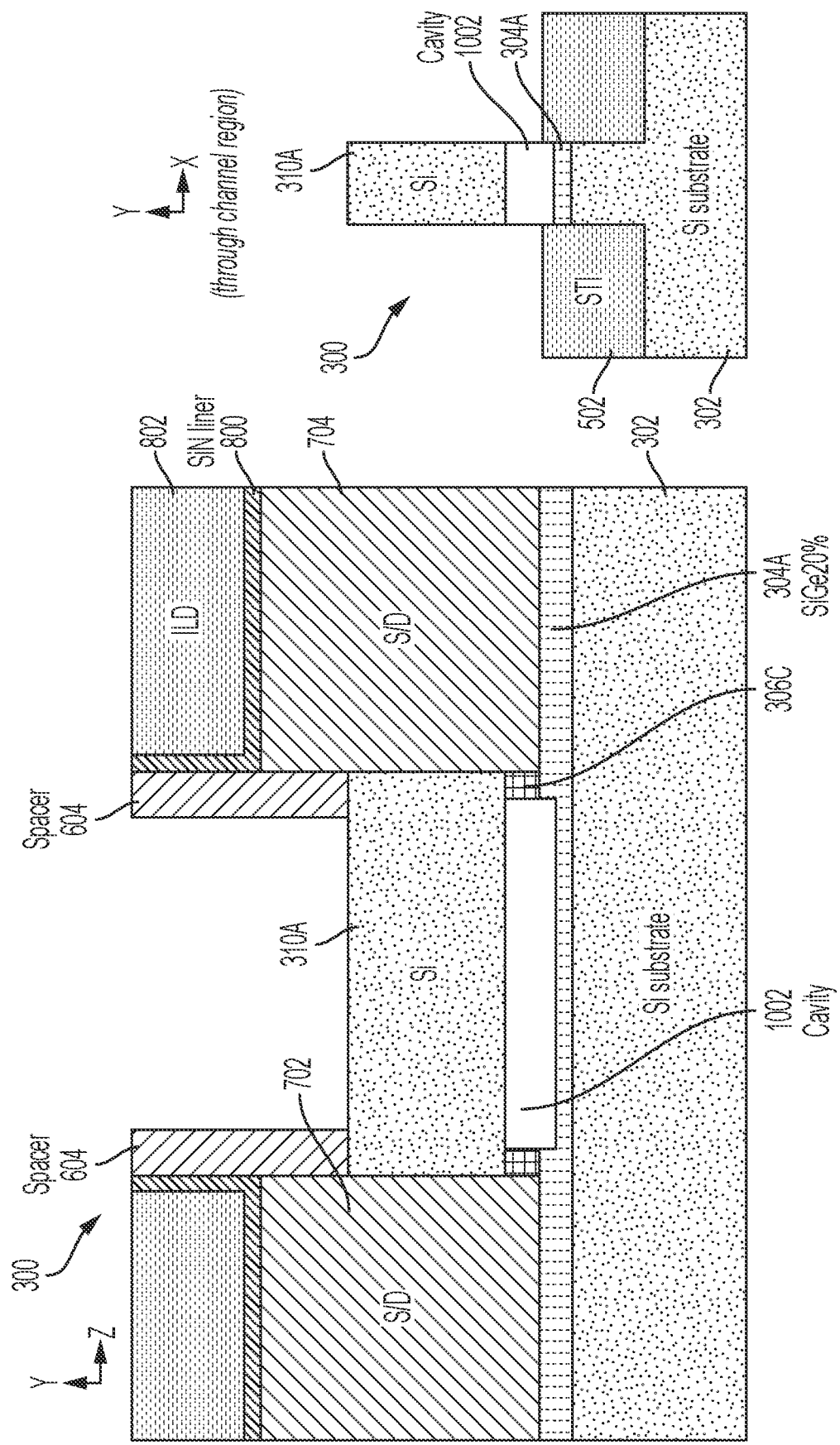
FIG. 10A depicts a cross-sectional view of the substrate/wafer after fabrication operations for forming the transistor shown in FIGS. 2A and 2B in accordance with embodiments of the invention.
FIG. 10B depicts a cross-sectional view of the substrate/wafer shown in FIG. 10A.
Figures 12A, 12B:
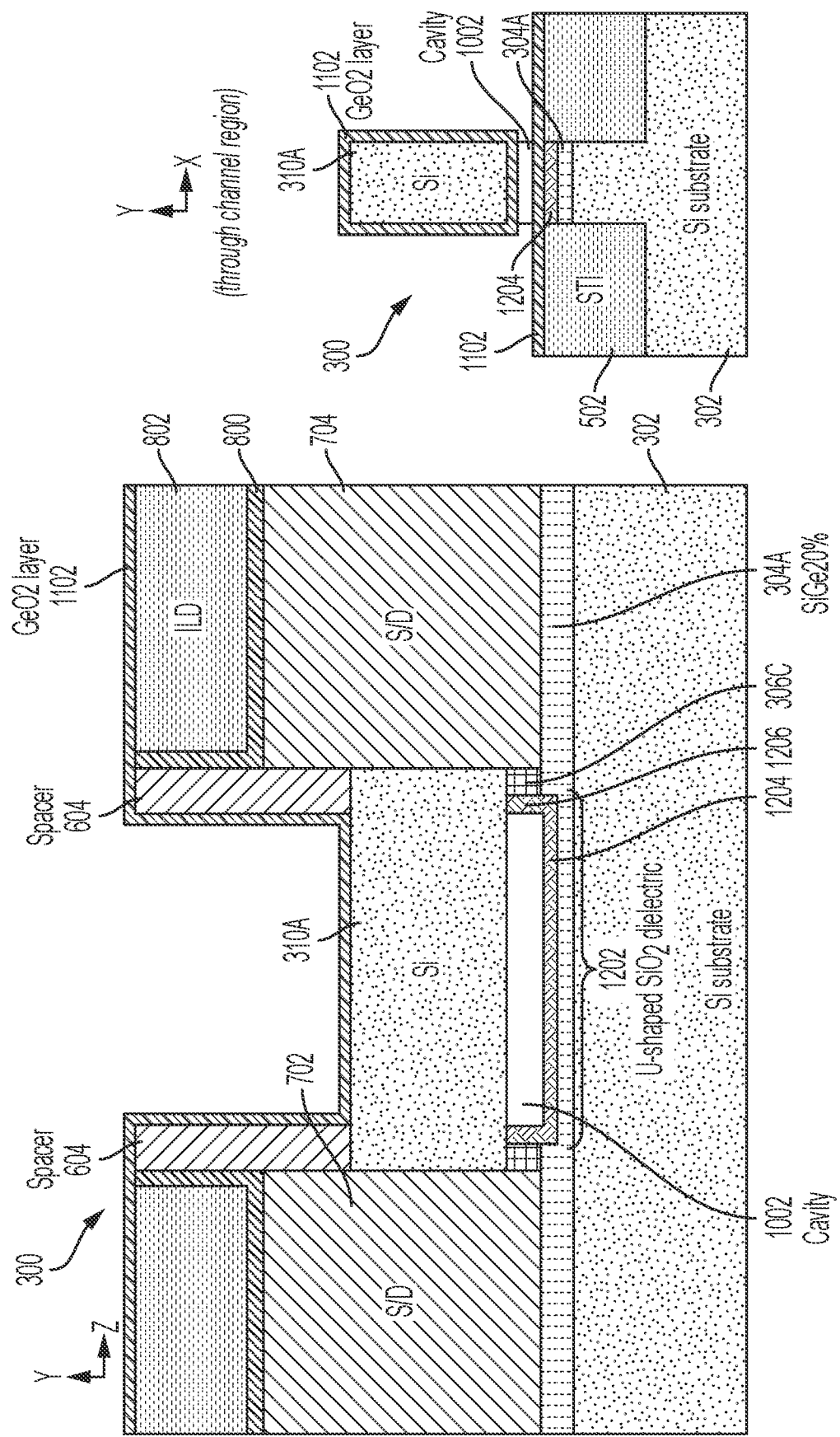
FIG. 12A depicts a cross-sectional view of the substrate/wafer after fabrication operations for forming the transistor shown in FIGS. 2A and 2B in accordance with embodiments of the invention.
FIG. 12B depicts a cross-sectional view of the substrate/wafer shown in FIG. 12A.

FIG. 10A depicts a cross-sectional view (along the Y/Z axis shown in FIG. 1) of the wafer 300 after additional fabrication operations in accordance with embodiments of the invention, and FIG. 10B depicts another cross-sectional view (along the X/Y axis shown in FIG. 1) of the wafer 300 shown in FIG. 10A. As best shown in FIG. 10A, known fabrication operations have been used to selectively remove a portion of the second SiGe 40% sacrificial layer 306A under the active fin 310A, thus leaving second SiGe 40% sacrificial regions 306C. As previously noted herein, the second SiGe sacrificial layer 306A has a Ge percentage that is sufficiently greater than the Ge percentage in the first SiGe sacrificial layer 304A to provide etch selectivity between the first sacrificial layer 304A and the second sacrificial layer 306A. The first sacrificial SiGe20% layer might be slightly etched during the SiGe40% removal process, however sufficient process margin can be provided to tolerate this. The open space under the active fin 310A after removal of a portion of the second sacrificial SiGe layer 306A forms a cavity (or sub-channel region) 1002.

FIGS. 11A-13B depict operations used to form a self-liming U-shaped dielectric layer 1202 (shown in FIG. 12A) in the cavity 1002 in accordance with aspects of the invention. The U-shaped dielectric 1202 can be formed according to aspects of the invention as a self-limiting dielectric 1202 that is fabricated in a manner that limits the formation of the dielectric 1202 to the bottom surface and sidewalls of the cavity 1002 where the dielectric 1202 is needed. Because the dielectric 1202 formed in accordance with aspects of the invention is not formed on the bottom surface of the active Si fin 310A, room is left in the cavity 1002 for formation of a bottom section of the wrap-around high-k metal gate (HKMG) 202, 202A (shown in FIGS. 2A, 2B).

In embodiments of the invention, the dielectric 1202 according to aspects of the invention is self-limiting in that it is formed according to a process that leverages a controlled chemical reaction. As shown in FIGS. 11A and 11B, the fabrication process can include forming a $GeO_2$ layer 1102 on the exposed surfaces of the wafer 300, and more specifically over the SiGe surfaces within the cavity 1002. The $GeO_2$ layer 1102 can be deposited by atomic layer deposition (ALD), chemical vapor deposition (CVD), or any other suitable deposition technique.

The controlled chemical reaction according to aspects of the invention is facilitated by applying at least one anneal operation to the $GeO_2$ layer 1102 and the SiGe in the region 306C and the first Si Ge sacrificial layer 304, wherein the at least one anneal operation is sufficient to result in the portion of the $GeO_2$ layer 1102 that is over the SiGe in the region 306C and the first SiGe sacrificial layer 304A interacting with the SiGe begin converting that portion of the $GeO_2$ layer to $SiO_2$. In some embodiments of the invention, the at least one anneal operation includes a first anneal at a first predetermined temperature (e.g., about 600 Celsius) in an inert gas environment (e.g., nitrogen, argon, helium, neon, hydrogen). In embodiments of the invention, a second anneal at a second predetermined temperature/environment can be applied, wherein the second predetermined temperature is less than the first predetermined temperature, and wherein the environment is also an inert gas (e.g., nitrogen, argon, helium, neon, hydrogen).

Figure 14:
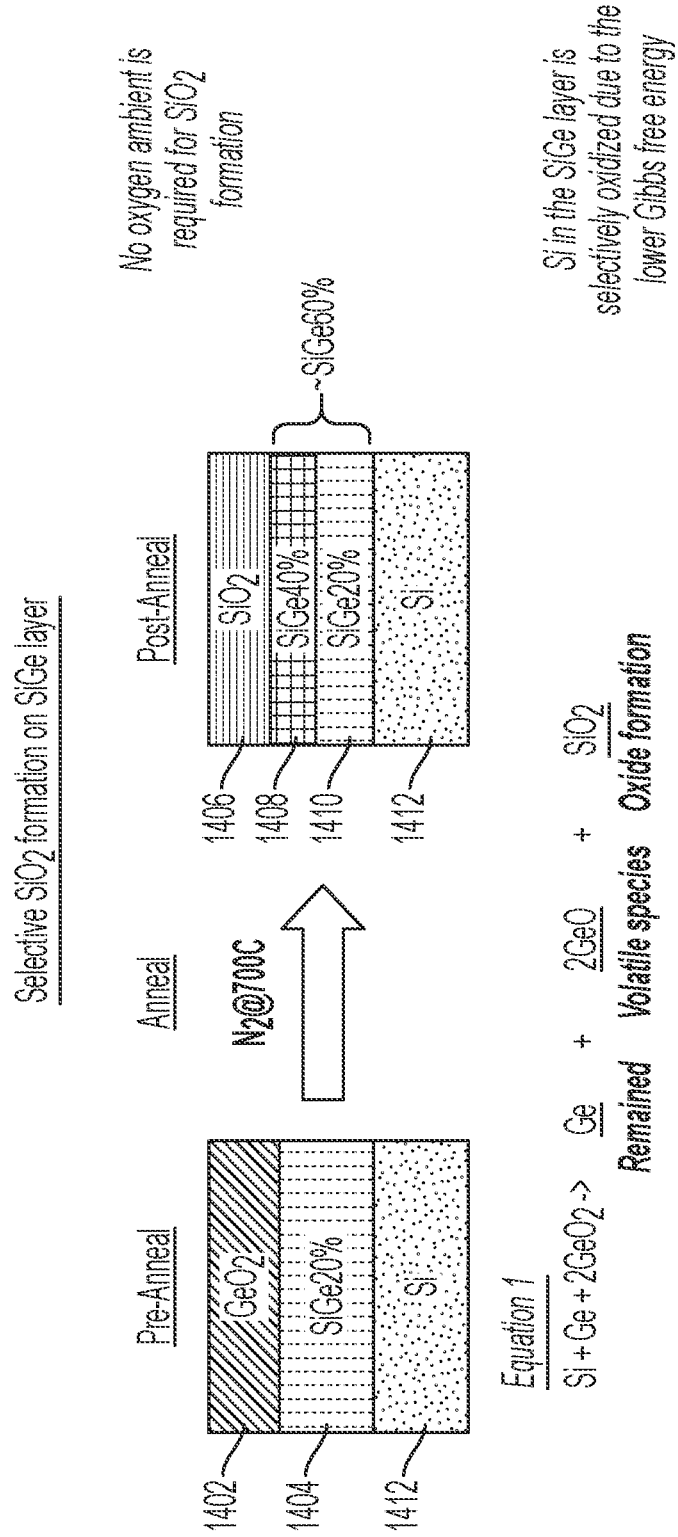
FIG. 14 depicts a diagram illustrating the selective formation of a silicon dioxide layer from an anneal-driven reaction between germanium dioxide and silicon germanium according to embodiments of the invention.

FIG. 14 depicts a diagram illustrating an example of the above-described selective formation of a $SiO_2$ layer from an anneal-driven reaction between $GeO_2$ and SiGe. As shown in FIG. 14, the pre-anneal structure is a $GeO_2$ layer 1402 over a SiGe 20% layer 1404, which is over a Si layer 1412. The notation "SiGe20%" indicates that the SiGe material contains 20% Ge and 80% Si. The post-anneal structure is a $SiO_2$ layer 1406 over a SiGe40% layer 1408, which is over a SiGe 20% layer 1410. The SiGe 20% layer 1410 is over the Si layer 1412.

The anneal reaction proceeds according to Equation 1 shown in FIG. 14. The $GeO_2$ layer 1402 will react with the SiGe 20% layer 1404, thus leading to a condensation of Ge and converting the $GeO_2$ layer 1402 to $SiO_2$, thereby forming the $SiO_2$ layer 1406. As the reaction proceeds, more Si in the SiGe20% layer 1404 is oxidized to $SiO_2$, and the surface of the SiGe20% layer 1404 is continuously enriched with additional Ge. The additional Ge flowing into the SiGe20% layer 1404 leads to a condensation of Ge that spreads inward from the surface interface between the layers 1402, 1404. As the reaction proceeds, and the Ge concentration in the SiGe layer 1408 continues to increase until the desired ratios are reached.

In embodiments of the invention, the self-limiting formation process can be well-controlled, as the reaction of $GeO_2$ with the SiGe only occurs during the anneal, which can, in some embodiments be a spike anneal at a temperature from about 500-700 degrees Celsius. The selective $SiO_2$ formation in this manner is self-limited and will continue until either all of the $GeO_2$ is consumed or the SiGe surface becomes sufficiently enriched with germanium that the Equation 1 reaction cannot proceed. For example, if a relatively thick $GeO_2$ layer 1102 is used, the reaction will stop when available Si atoms are not enough at the SiGe surface. Consequently, the severity of the self-limiting formation process can be tuned by adjusting the thickness of the $GeO_2$ layer 1102 that has been deposited on the SiGe region 306C and the SiGe first sacrificial layer 304A, or by adjusting the anneal temperature/duration.

The remaining exposed portions of the wafer 300 are formed from a material (e.g., SiN) that does not react with $GeO_2$. Accordingly, the annealing method of the present invention is highly selective to SiGe, and, after the necessary reactions shown in Equation 1 have completed, the unreacted $GeO_2$ in the can be easily removed by exposing it to a water containing wash because $GeO_2$ is water soluble, which is depicted in FIGS. 13A, 13B.

Figures 13A, 13B:
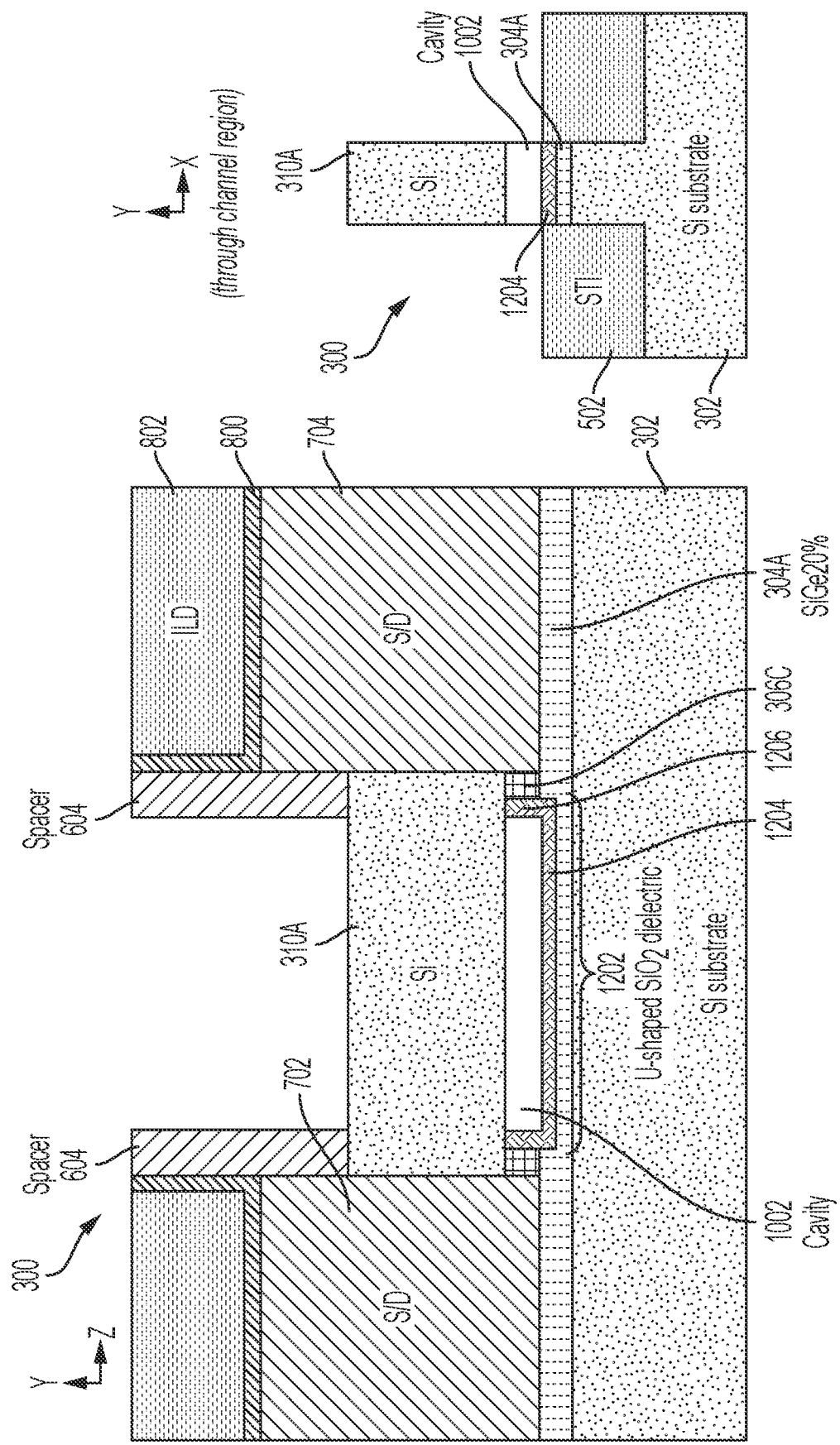

After the fabrication operations depicted in FIGS. 13A, 13B, the spaces defined by the removed dummy gate 602 and the cavity 1002 are filled with a final wrap-around gate structures 202, 202A to form the final FinFET 200 shown in FIG. 2A, 2B. The wrap-around final gate structure 202, 202a can be a high-k gate dielectric 202A and a metal gate 202. In general, suitable gate dielectrics 202A can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

In general, the gate conductor 202 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a workfunction setting layer between the gate dielectric 202A and gate conductor 200. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct " " means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a channel having a bottom surface, sidewalls, and a top surface;
a first source or drain (S/D) region communicatively coupled to the channel;
a sub-channel region between the bottom surface of the channel and a substrate;
a U-shaped dielectric region within a first portion of the sub-channel region;
wherein the U-shaped dielectric region comprises a bottom isolation layer and a first inner spacer region; and
a wrap-around gate structure extending around the bottom surface, the sidewalls and the top surface of the channel, wherein a bottom region of the wrap-around gate structure is within a second portion of the sub-channel region;
a layer of a first type of semiconductor material between the bottom isolation layer and the substrate; and
a first semiconductor region between the first S/D region and the bottom region of the wrap-around gate structure;
wherein the first semiconductor region comprises a third type of semiconductor material having etch selectivity with respect to the first type of semiconductor material.

2. The semiconductor device of claim 1, wherein:
the channel comprises a fin-shaped channel, wherein a height dimension of each of the sidewalls is greater than a width dimension of the bottom surface;
the bottom isolation layer provides electrical isolation between the fin-shaped channel from the substrate; and
the first inner spacer region reduces parasitic capacitance between the bottom region of the wrap-around gate structure and the first S/D region.

3. The semiconductor device of claim 1, wherein:
the channel comprises a fin-shaped channel, wherein a height dimension of each of the sidewalls is greater than a width dimension of the bottom surface;
the semiconductor device further comprises a second S/D region communicatively coupled to the fin-shaped channel; and
the U-shaped dielectric region further comprises a second inner spacer region.

4. The semiconductor device of claim 3, wherein the second inner spacer reduces parasitic capacitance between the bottom region of the wrap-around gate structure and the second S/D region.

5. The semiconductor device of claim 1, wherein the substrate comprises a second type of semiconductor material.

6. The semiconductor device of claim 5, wherein the first type of semiconductor material is different from the second type of semiconductor material.

7. The semiconductor device of claim 1, wherein the first inner spacer region reduces parasitic capacitance between the bottom region of the wrap-around gate structure and the first S/D region.

8. A method of forming a semiconductor device, the method comprising:
   forming a channel having a bottom surface, sidewalls, and a top surface;
   forming a first source or drain (S/D) region communicatively coupled to the channel;
   forming a sub-channel region between the bottom surface of the channel and a substrate;
   forming a U-shaped dielectric region within a first portion of the sub-channel region;
   wherein the U-shaped dielectric region comprises a bottom isolation layer and a first inner spacer region;
   forming a wrap-around gate structure extending around the bottom surface, the sidewalls and the top surface of the channel, wherein a bottom region of the wrap-around gate structure is within a second portion of the sub-channel region;
   forming a layer of a first type of semiconductor material between the bottom isolation layer and the substrate; and
   forming a first semiconductor region between the first S/D region and the bottom region of the wrap-around gate structure;
   wherein the first semiconductor region comprises a third type of semiconductor material having etch selectivity with respect to the first type of semiconductor material.

9. The method of claim 8, wherein:
   the channel comprises a fin-shaped channel, wherein a height dimension of each of the sidewalls is greater than a width dimension of the bottom surface;
   the bottom isolation layer provides electrical isolation between the fin-shaped channel from the substrate; and
   the first inner spacer region reduces parasitic capacitance between the bottom region of the wrap-around gate structure and the first S/D region.

10. The method of claim 8, wherein:
    the channel comprises a fin-shaped channel, wherein a height dimension of each of the sidewalls is greater than a width dimension of the bottom surface; and
    the method further comprises a second S/D region communicatively coupled to the fin-shaped channel, wherein the U-shaped dielectric region further comprises a second inner spacer region.

11. The method of claim 10, wherein the second inner spacer reduces parasitic capacitance between the bottom region of the wrap-around gate structure and the second S/D region.

12. The method of claim 8, wherein the substrate comprises a second type of semiconductor material.

13. The method of claim 12, wherein the first type of semiconductor material is different from the second type of semiconductor material.

14. The method of claim 8, wherein the first inner spacer region reduces parasitic capacitance between the bottom region of the wrap-around gate structure and the first S/D region.

15. The method of claim 8, wherein forming the U-shaped dielectric region comprises;
    forming a layer of reactive material within the sub-channel region and on the layer of the first type of semiconductor material, wherein the layer of reactive material comprises an oxide of a first element of the first type of material; and
    applying an anneal to:
       drive the first element of the first type of material from the layer of reactive material into the layer of the first type of material;
       drive a second element of the first type of material from the layer of the first type of material into the layer of reactive material; and
       convert at least a portion of the first layer of reactive material to an oxide of the second element of the first type of semiconductor material, wherein the oxide of the second element of the first type of material comprises the U-shaped dielectric region.

\* \* \* \* \*